United States Patent [19]

Salsbury et al.

[11] 4,114,255
[45] Sep. 19, 1978

[54] FLOATING GATE STORAGE DEVICE AND METHOD OF FABRICATION

[75] Inventors: Phillip J. Salsbury, Sunnyvale; George Perlegos, Santa Clara; William L. Morgan, Cupertino, all of Calif.

[73] Assignee: Intel Corporation, Santa Clara, Calif.

[21] Appl. No.: 792,496

[22] Filed: May 2, 1977

Related U.S. Application Data

[63] Continuation-in-part of Ser. No. 714,879, Aug. 16, 1976, abandoned.

[51] Int. Cl.² ............................................. B01J 17/00
[52] U.S. Cl. ...................................... 29/571; 29/578; 357/23; 357/29
[58] Field of Search ................................. 29/571, 578

[56] References Cited

U.S. PATENT DOCUMENTS

| 3,752,711 | 8/1973 | Kooi | 29/571 |
| 3,789,504 | 2/1974 | Joddam | 29/578 |
| 3,889,358 | 6/1975 | Bierhenke | 29/571 |

Primary Examiner—W. Tupman
Attorney, Agent, or Firm—Blakely, Sokoloff, Taylor & Zafman

[57] ABSTRACT

A floating gate storage device in which the channel is maintained at a first doping concentration to provide a low threshold voltage and preselected portions or regions along the sides of the channel are maintained at a second higher doping concentration to enhance programming of the device. These regions are formed as part of the "front-end" processing of the substrate while forming channel stops, thus no additional processing is required.

9 Claims, 6 Drawing Figures

FLOATING GATE STORAGE DEVICE AND METHOD OF FABRICATION

This is a continuation-in-part of Ser. No. 714,879, filed Aug. 16, 1976, now abandoned.

BACKGROUND OF THE INVENTION

1. Field of the Invention

The invention relates to the field of semiconductor devices and in particular to programmable devices having floating gates.

2. Prior Art

Metal-oxide-silicon (MOS) devices are well-known and used in the prior art. In particular, a MOS device using a floating gate has been suggested as a memory element, where the floating gate is either electrically charged or not charged and used in a similar fashion to other bistable devices such as magnetic cores, flip-flops, etc. Such MOS floating gate devices are described in U.S. Pat. No. 3,660,819, issued May 2, 1972, to Dov Frohman-Bentchkowsky, entitled "Floating Gate Transistor and Method for Charging and Discharging Same". In order to charge the floating gate to program such MOS device, it is necessary to have a source of high-energy electrons near the gate and to apply a high voltage between the drain terminal and the substrate to cause an avalanche injection of these electrons into the floating gate.

As the prior art went to denser and faster structures, n-channel MOS devices were employed rather than p-channel. These n-channel devices are described in U.S. Pat. No. 3,996,657. In addition to the reversal of the conductivity types of the various regions, these n-channel devices commonly employ two gates, the usual floating gate and an additional gate located above the floating gate, used as a control gate. This control gate is employed to charge the floating gate and for device selection. Charge is normally injected into the floating gate from the channel region rather than from the source or drain region as in the case of the previously described p-channel floating gate devices. This is sometimes referred to as channel injection as opposed to the earlier avalanche injection.

In U.S. Pat. No. 3,868,187 a p-channel avalanche injection, floating gate device is described. This device includes n-type regions adjacent to the channel for lowering the avalanche breakdown voltage, thereby providing lower-voltage programming. With the invented device and process, regions adjacent to the channel are employed to allow lower-voltage channel injection. However, unlike the prior art, these regions are formed with the "front-end" processing and are in-effect channel stops. By employing the invented process, automatic alignment of these regions with the gate is achieved. Moreover, the regions are formed without additional processing since they are formed with the channel stops.

SUMMARY OF THE INVENTION

An MOS process is described for fabricating a floating gate memory device on a silicon substrate. An area on the substrate is defined with a masking means which includes a layer of silicon nitride. The substrate is then subjected to a dopant which forms a first doped regions adjacent to this masking means. Next, a field oxide layer is formed on the substrate; this oxide layer abuts the masking means. After the masking means has been removed, a floating gate is formed in the area, insulated from the substrate. The doped regions are aligned along the sides of the channel and thus permit charge to be more easily injected into the floating gate.

BRIEF DESCRIPTION OF THE INVENTION

An improved process for forming a field-effect device, such as an MOS device, having a floating gate which is particularly useful as a component in a read-only memory is disclosed. The presence or lack of an electrical charge in the floating gate is sensed and this information is used in the same manner as other bi-stable memory devices such as magnetic cores and flip-flops are used in forming a memory array. Once the floating gate of the device is charged, the charge remains substantially permanently (but can be erased) and the existence or non-existence of the charge in the floating gate is readily ascertainable by sensing the conductivity characteristics between the source and the drain of the device.

Figure 1:
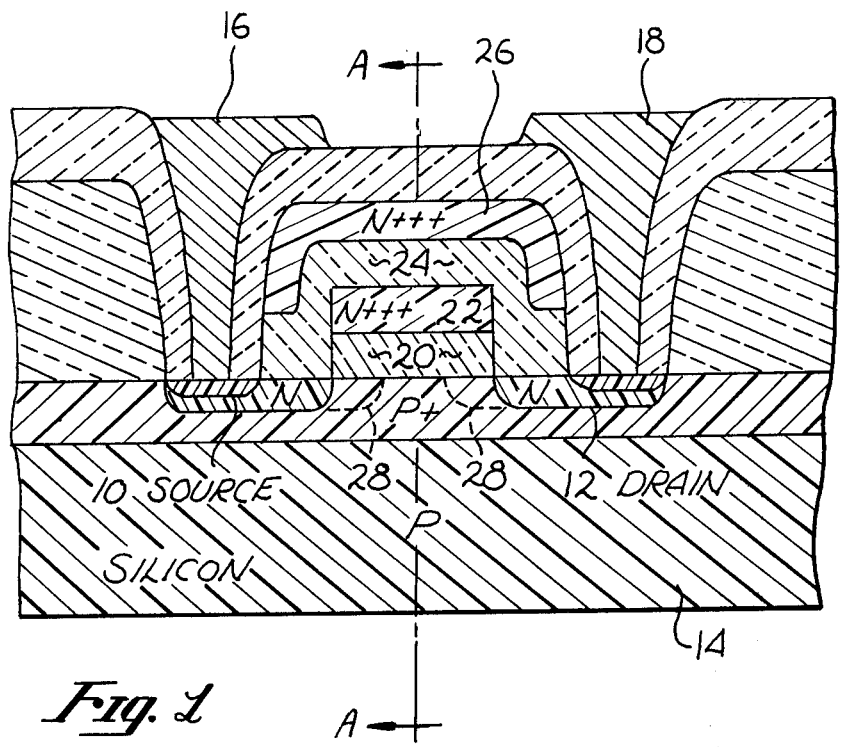
FIG. 1 is a cross-sectional elevation view of a floating gate device as disclosed in the prior art.

Referring to FIG. 1, a prior floating gate device is illustrated which comprises a source region 10 and a drain region 12 which are located in a substrate 14. In an n-channel device, the substrate 14 comprises a p-type silicon having a typical doping concentration of $2 \times 10^{+15} cm^{-3}$ while the source and drain regions 10 and 12 are of an n-type conductivity having a typical doping concentration of $10^{20} cm^{-3}$. Metal contacts 16 and 18 are coupled to regions 10 and 12 to allow a current to flow between regions 10 and 12 and to apply a source of voltage to the drain region 12. An insulative layer 20 separates the floating gate 22 from the substrate 14 and regions 10 and 12. A second insulative layer 24 insulates the floating gate 22 from the contacts 16 and 18 and from the select gate 26, which has another source of voltage coupled thereto. The gates 22 and 26 are generally made from polycrystalline silicon. If a voltage on the order of 3 volts is applied to the drain region 12 through contact 18, a current will flow in the channel region 28 between the source 10 and the drain 12 depending on the gate voltage and the threshold voltage of the device, i.e., the gate voltage required to achieve strong inversion in the channel 28. The threshold voltage of the device is dependent on the doping concentration in the channel 28 and for a doping concentration $5 \times 10^{16}$ will be approximately 4V measured from gate 26. Thus a gate voltage on the order of 5 volts would allow a current to flow in the channel region 28 in the absence of an electron charge on the floating gate 22. If the device is programmed by placing a charge on the floating gate 22, the effective threshold voltage of the device is raised so that current no longer flows in the channel region 28 at a gate voltage of 5 volts. A threshold voltage shift on the order of 8-10 volts is caused, requiring a gate voltage somewhat in excess of 12 volts to once again allow current to flow in the channel region 28. Thus the device has an unprogrammed state which requires a gate voltage in excess of 12 volts to cause the device to conduct.

Charge is placed on the floating gate 22 using injection of electrons from the channel 28. It is not only necessary to bias the device into heavy saturation by placing high voltages on the gate 26 and on the drain 12, but also to provide the doping concentration in the channel region to at least $2 \times 10^{16}$ cm$^{-3}$, and preferably $5 \times 10^{16}$ cm$^{-3}$ in order to obtain a sufficiently higher channel current near the surface of the substrate 14 to be able to cause electrons to pass through the insulative layer 20 onto the floating gate 22. The electrons which pass onto the floating gate 22 are believed to arise from the channel region near the pinch-off point of the inversion layer in the channel 28 caused by the high gate voltage of the order of 25 volts and drain voltage of 20 volts. The electrons in the inversion layer are accelerated by the high field between the source 10 and the drain 12 toward the drain 12 and at the pinch-off point acquire sufficient energy to cause them to leave the substrate 14 and pass through the insulative layer 20 to the floating gate 22. When the doping concentration is increased in the channel 28, however, to be able to charge the floating gate 22 by channel injection, an accompanying increase in the threshold voltage is caused due to the increased doping concentration and an accompanying decrease in the current in the channel 28. Thus, an increase of doping concentration from $2 \times 10^{15}$ cm$^{-3}$ to $5 \times 10^{16}$ cm$^{-3}$ has been found to cause an increase in the threshold voltage of approximately 5 volts and a decrease in channel current from 200 ua to 10 ua.

Figure 2:
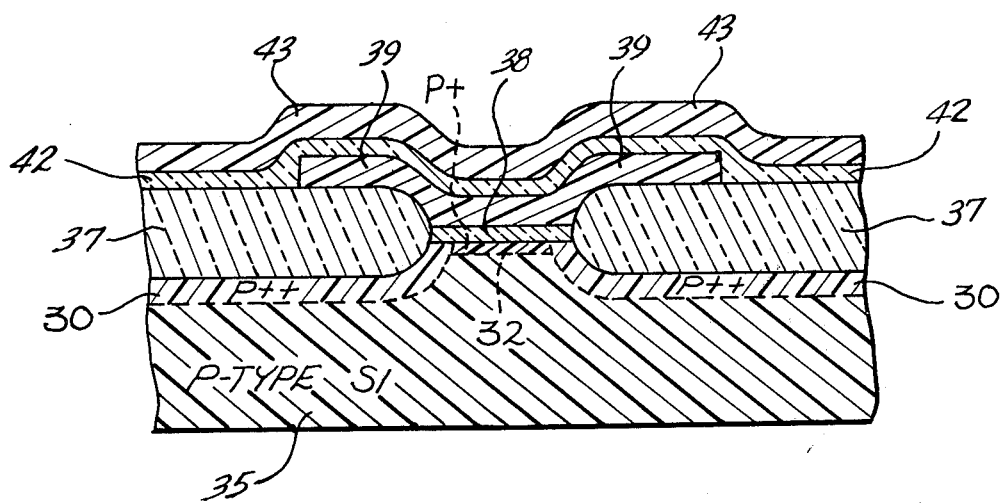
FIG. 2 is a cross-sectional elevation view of a floating gate device taken along the line A—A of FIG. 1 built in accordance with the teachings of the present invention.

In FIG. 2, a cross-sectional view of a field effect device built in accordance with the teachings of the present invention is illustrated on a substrate 35. The below description may be best understood with reference to the structure shown in FIG. 1, taken along the lines A—A, although the process for building the structure shown in FIG. 2 is different from that used to build the structure shown in FIG. 1. The device includes a gate oxide 38 which separates the channel region 32 from the floating gate 39. The control gate 43 is insulated from the gate 39 by oxide layer 42.

Figure 4:
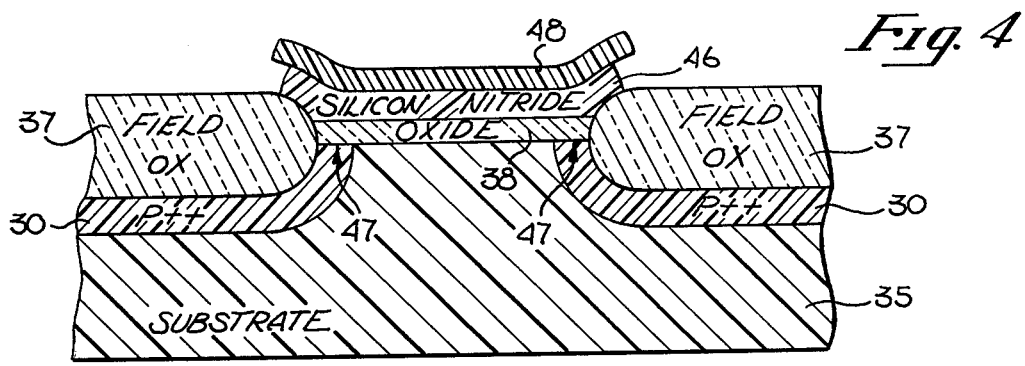
FIG. 4 illustrates the substrate of FIG. 3 after a field oxide has been formed on the substrate.
Figure 5:
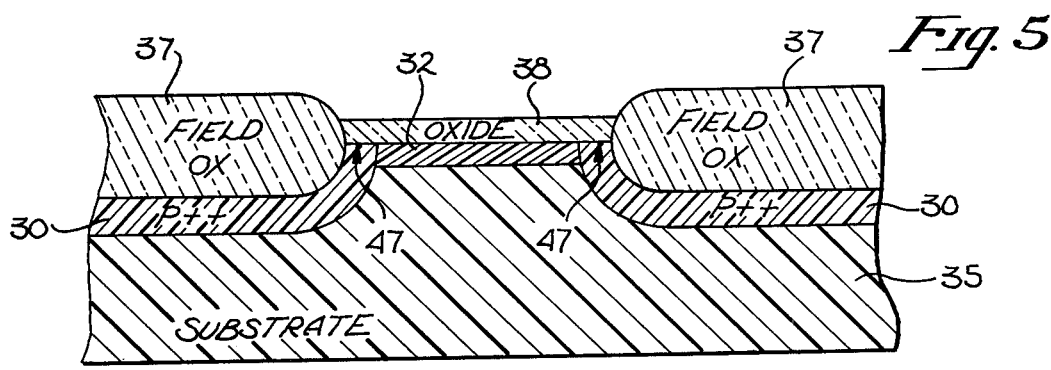
FIG. 5 illustrates the substrate of FIG. 4 after the silicon nitride layer has been removed and a doped region formed below an oxide layer; and, FIG. 6 is a cross-sectional plan view of the device of FIG. 2.
Figure 6:
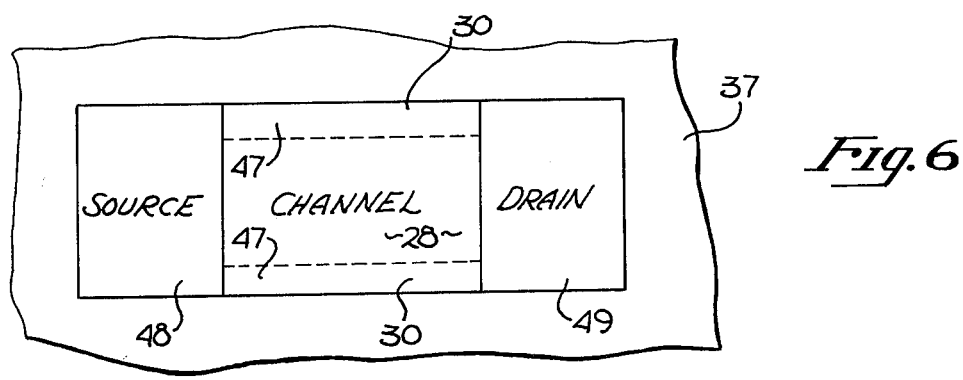

In FIGS. 2 and 6, the device of the present invention is shown having regions 30 along the sides of the channel which have a doping concentration of $5 \times 10^{16}$ cm$^{-3}$. The channel region 32 has a doping concentration of $1 \times 10^{16}$ cm$^{-3}$, compared to the doping concentration of $5 \times 10^{14}$ cm$^{-3}$ of the substrate 14. Region 32 provides a more heavily doped surface region for the channel and provides the desired threshold voltage for the device and the desired level of current in the channel between the source 10 and the drain 12. Regions 30 provide a pair of heavily doped regions extending between the source 48 and the drain 49 along the sides of the channel region 28 and, as explained above, provide a source of electrons which are used to charge the floating gate 22 upon the application of the voltages $V_G$ and $V_D$ on the gate 43 and the drain 49. In a particular embodiment of the device the width of the channel is approximately 6 microns and the regions 30 extend under the gate approximately 1 micron on each side (distance 47 of FIGS. 4 and 5).

Figure 3:
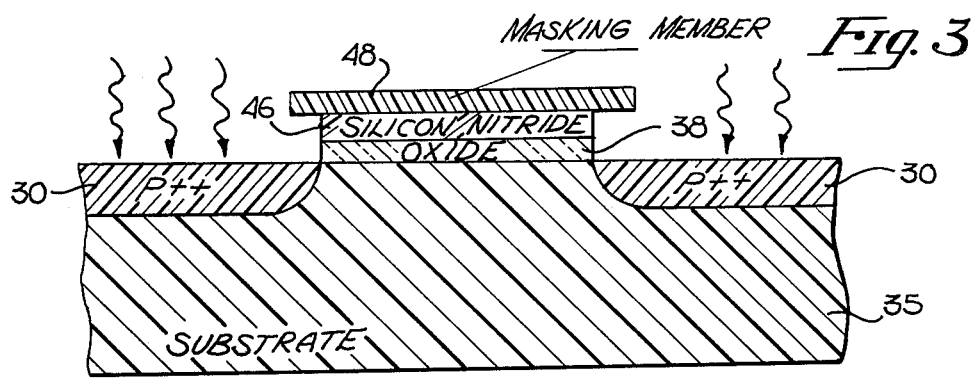
FIG. 3 is a cross-sectional elevation view of the substrate shown in FIG. 2 prior to the formation of the floating gate device. The area at which the floating gate device is formed is covered by an oxide layer and a silicon nitride layer.

Referring to FIG. 3, in a particular process, the area of the substrate 35 selected from the channel and the source and drain is masked by an oxide layer 38 and a silicon nitride layer 46 which are formed from a masking member 48. A first boron implant is performed to form regions 30. A high temperature field drive step is used to drive the implant into the substrate 35.

The field oxide layer 37 (FIG. 4) is then thermally grown on the substrate 35, driving the regions 30 deeper into the substrate 14. The layer 37 will not, however, grow on the nitride layer. Thus the field oxide layer 37 abuts the area masked for the storage device. The lateral diffusion of the boron into the channel region for the storage device is shown as distance 47 in FIG. 4.

The masking member and nitride layer are then removed and a second boron implant performed through the oxide layer 38 which is approximately 850 A° thick to provide the desired doping concentration for the channel region 32 (FIG. 5). The floating gate 39, the insulative layer 42, the control gate 43 and the source and drain region may then be formed. In the presently preferred embodiment, the floating gate and control gate are aligned with the souce and drain regions by a process disclosed in copending application Ser. No. 771,521 filed Feb. 24, 1977 and assigned to the assignee of this application.

It should be noted that since the same silicon nitride layer 46 and oxide layer 38 used to define the channel are used to mask the first boron implant, the first boron implant is self-aligned with the channel of the device. The first boron implant is independent of the doping concentration in the channel, and the unprogrammed threshold of the device is substantially set by the second boron implant. If the doping concentration in the channel is already sufficiently high, the second implant would not be necessary.

It is known in the prior art to form channel stops in the manner above described for regions 30 as part of the "front end" wafer processing. Thus the regions 30 may be formed simultaneously with the formation of channel stops. When this is done, the regions 30 used for the floating gate devices are obtained without additional processing steps.

Having thus described the invention, it is obvious that numerous modifications and departures may be made by those skilled in the art; thus the invention is to be construed as being limited only by the spirit and scope of the appended claims.

We claim:

1. In a process for fabricating a floating gate memory device on a silicon substrate of a first conductivity type, the steps of:

defining a channel area on said substrate with a masking means which includes silicon nitride;

subjecting said substrate to a dopant of said first conductivity type so as to form first doped regions adjacent to first opposite sides of said channel area;

forming an oxide layer on said substrate abutting said masking means;

removing said masking means;

forming a floating gate insulated from said substrate above said channel area;

forming a source and drain region of a second conductivity type at second opposite sides of said channel area;

whereby regions along said first sides of said gate are doped, thereby permitting charge to be more easily injected into said floating gate.

2. The process defined by claim 1 wherein said substrate comprises a p-type material.

3. The process defined by claim 2 wherein said step of subjecting said substrate to a dopant comprises ion implantation with boron.

4. The process defined by claim 3 including a driver-step for driving said implanted boron into said substrate so as to cause said boron to be diffused into said first opposite sides of said channel area.

5. The process defined by claim 4 including a second doping step which dopes said channel area after removing at least a portion of said masking means and prior to the formation of said floating gate.

6. The process defined by claim 5 wherein said second doping step comprises boron implantation through an oxide layer.

7. In a process for fabricating a floating gate memory device on a p-type silicon substrate, an improvement in said process for forming p-type regions along first opposite sides of a channel area in order to permit easier programming of said gate from said channel area, comprising the steps of:

defining said channel area on said substrate with a mask which includes a layer of silicon nitride;

subjecting said substrate to boron implantation so as to form said p-type regions along said first opposite sides of said channel area;

forming a field oxide layer on said substrate abutting said mask;

removing at least a portion of said mask;

forming said floating gate at said channel area;

forming source and drain regions along second opposite sides of said channel area;

whereby regions which enable easier programming of said floating gate are formed in alignment with said floating gate.

8. The process defined by claim 7 wherein said mask includes a gate oxide layer.

9. The process defined by claim 8 including boron implanting said channel area through said gate oxide layer after said removal of said portion of said mask.

* * * * *